United States Patent

Fukazawa

(10) Patent No.: US 11,056,345 B2
(45) Date of Patent: Jul. 6, 2021

(54) METHOD FOR MANUFACTURING SEMICONDUCTOR DEVICE

(71) Applicant: ASM IP Holding B.V., Almere (NL)

(72) Inventor: Atsuki Fukazawa, Tama (JP)

(73) Assignee: ASM IP Holding B.V., Almere (NL)

( * ) Notice: Subject to any disclaimer, the term of this patent is extended or adjusted under 35 U.S.C. 154(b) by 212 days.

(21) Appl. No.: 15/847,681

(22) Filed: Dec. 19, 2017

(65) Prior Publication Data

US 2019/0189454 A1    Jun. 20, 2019

(51) Int. Cl.
| | |
|---|---|
| *H01L 21/285* | (2006.01) |
| *C23C 16/455* | (2006.01) |
| *C23C 16/34* | (2006.01) |
| *C23C 16/517* | (2006.01) |
| *C23C 16/06* | (2006.01) |

(52) U.S. Cl.
CPC .. *H01L 21/28568* (2013.01); *C23C 16/45527* (2013.01); *C23C 16/45536* (2013.01); *C23C 16/45538* (2013.01); *C23C 16/517* (2013.01); *C23C 16/06* (2013.01); *C23C 16/34* (2013.01)

(58) Field of Classification Search
CPC .............. C23C 16/0281; C23C 16/34; C23C 16/45536; C23C 16/303; C23C 16/06–20; C23C 16/45525; H01L 21/28568
See application file for complete search history.

(56) References Cited

U.S. PATENT DOCUMENTS

| | | | | |
|---|---|---|---|---|
| 6,090,709 A | * | 7/2000 | Kaloyeros | C23C 16/14 257/E21.168 |
| 2002/0187261 A1 | * | 12/2002 | Pyo | H01L 21/76846 427/255.7 |
| 2003/0072884 A1 | * | 4/2003 | Zhang | C23C 16/14 427/255.391 |
| 2008/0241555 A1 | * | 10/2008 | Clark | C23C 16/34 428/457 |
| 2015/0037980 A1 | * | 2/2015 | Rha | H01L 21/306 438/700 |
| 2015/0315704 A1 | * | 11/2015 | Nakano | C23C 16/45538 427/569 |

FOREIGN PATENT DOCUMENTS

| | | |
|---|---|---|
| JP | 10237662 A | 9/1998 |
| JP | 2000068232 A | 3/2000 |
| JP | 2000160341 A | 6/2000 |

* cited by examiner

*Primary Examiner* — Elizabeth A Burkhart
(74) *Attorney, Agent, or Firm* — Dorsey & Whitney LLP (57) ABSTRACT

Examples of a method for manufacturing a semiconductor device include forming an initial film having a film thickness of 1 to 3 nm made of a metal or a metal nitride by applying plasma film formation with plasma power of 0.07 to 0.30 $W/cm^2$ and an RF pulse width within a range of 0.1 to 1 sec, and forming, after forming the initial film, a bulk film made of a metal or metal nitride on the initial film by applying plasma film formation with plasma power higher than the plasma power when the initial film is formed.

18 Claims, 9 Drawing Sheets

FIG. 1

Sequence 1
Pulse CVD

| Parameter | Initial-Depo | Treatment 1 | Bulk-Depo | Treatment 2 |
|---|---|---|---|---|
| Precursor | ▓ | | ▓ | |
| N2/H2 or NH3 | ▓ | ▓ | ▓ | ▓ |
| Carrier-Gas | ▓ | ▓ | ▓ | ▓ |
| Dilution-Gas | ▓ | ▓ | ▓ | ▓ |
| RF | Low Power | Low Power | High Power | High Power |

M TIMES (Initial-Depo, Treatment 1) — N TIMES (Bulk-Depo, Treatment 2)

Sequence 2
Pulse CVD

| Parameter | Initial-Depo | Treatment 1 | Bulk-Depo | Treatment 2 | Cap Depo | Treatment 3 |
|---|---|---|---|---|---|---|
| Precursor | ■ |  | ■ |  | ■ |  |
| H2[for metal] | ■ | ■ | ■ | ■ | ■ | ■ |
| N2 or NH3 |  |  |  |  | ■ | ■ |
| Carrier-Gas | ■ | ■ | ■ | ■ | ■ | ■ |
| Dilution-Gas | ■ | ■ | ■ | ■ | ■ | ■ |
| RF | Low Power | Low Power | High Power | High Power |  |  |

Initial-Depo + Treatment 1: M TIMES
Bulk-Depo + Treatment 2: N TIMES

FIG. 4

- TiN (cap layer) — 18
- Ti (bulk layer) — 14
- Ti (initial layer) — 12
- SiO (wafer) — 10

FIG. 5

Sequence 3
Pulse CVD

| Parameter | Nitride-Depo | Treatment 1 | Metal-Depo | Treatment 2 |
|---|---|---|---|---|
| Precursor | ■ | | ■ | |
| H2[for metal] | ■ | ■ | ■ | ■ |
| N2 or NH3 | ■ | ■ | | |
| Carrier-Gas | ■ | ■ | ■ | ■ |
| Dilution-Gas | ■ | ■ | ■ | ■ |
| RF | High Power | High Power | High Power | High Power |

M TIMES (Nitride-Depo + Treatment 1)    N TIMES (Metal-Depo + Treatment 2)

FIG. 6

| Ti (metel) | ~26 |
| TiN (metal nitride) | ~24 |
| Ti (metal) | ~22 |
| TiN (metal nitride) | ~20 |
| SiO (wafer) | ~10 |

FIG. 7

Sequence 4
PEALD

| Parameter | Feed 1 | Purge 1 | RF 1 | Purge 2 | Feed 2 | Purge 3 | RF 2 | Purge 4 |
|---|---|---|---|---|---|---|---|---|
| Precursor | ■ | | | | ■ | | | |
| Reactant | ■ | ■ | ■ | ■ | ■ | ■ | ■ | ■ |
| Carrier-Gas | ■ | ■ | ■ | ■ | ■ | ■ | ■ | ■ |
| Dilution-Gas | ■ | ■ | ■ | ■ | ■ | ■ | ■ | ■ |
| RF | | | Low Power | | | | High Power | |

M TIMES — N TIMES

Sequence 5
PEALD

| Parameter | Feed 1 | Purge 1 | RF 1 | Purge 2 | Feed 2 | Purge 3 | RF 2 | Purge 4 | Feed 3 | Purge 5 | RF 3 | Purge 6 |
|---|---|---|---|---|---|---|---|---|---|---|---|---|
| Precursor | ■ | | | | ■ | | | | ■ | | | |
| H2 for metal | | ■ | ■ | ■ | ■ | ■ | ■ | ■ | ■ | ■ | ■ | ■ |
| N2 or NH3 | | | ■ | | | | ■ | | | | ■ | |
| Carrier Gas | ■ | ■ | ■ | ■ | ■ | ■ | ■ | ■ | ■ | ■ | ■ | ■ |
| Dilution Gas | ■ | ■ | ■ | ■ | ■ | ■ | ■ | ■ | ■ | ■ | ■ | ■ |
| RF | | | Low Power | | | | High Power | | | | High Power | |

{ Feed 1, Purge 1, RF 1, Purge 2 } M TIMES
{ Feed 2, Purge 3, RF 2, Purge 4 } N TIMES

FIG. 10

Sequence 6
PEALD

| Parameter | Feed 1 | Purge 1 | RF 1 | Purge 2 | Feed 2 | Purge 3 | RF 2 | Purge 4 |
|---|---|---|---|---|---|---|---|---|
| Precursor | ■ | | | | ■ | | | |
| H2[for metal] | ■ | ■ | ■ | ■ | ■ | ■ | ■ | ■ |
| N2 or NH3 | ■ | ■ | ■ | | | | | |
| Carrier-Gas | ■ | ■ | ■ | ■ | ■ | ■ | ■ | ■ |
| Dilution-Gas | ■ | ■ | ■ | ■ | ■ | ■ | ■ | ■ |
| RF | | | Low Power | | | | High Power | |

M TIMES (Feed 1 – Purge 2), N TIMES (Feed 2 – Purge 4)

FIG. 11

| Condition | Process Temperature[°C] | Initial-reaction gas | Bulk-reaction gas | Resistivity [uΩcm] | Rate of increase in Resistivity[%] |
|---|---|---|---|---|---|
| Reference | 450 | - | O2 | 74 | 12.1 |
| 1 | 350 | - | O2 | 68 | 3 |
| 2 | 450 | CO2(3nm) | O2(12nm) | 68 | 3 |

FIG. 12

| example | process | temperature [°C] | pressure [Pa] | 1st Layer N2 (slm) | 1st Layer H2 (slm) | 1st Layer Ar (slm) | 1st Layer RF (W) | 1st Layer RF-Time (s) | 2nd Layer N2 (slm) | 2nd Layer H2 (slm) | 2nd Layer Ar (slm) | 2nd Layer RF (W) | 2nd Layer RF-Time (s) | THK 1st/2nd | Sequence | Film structure |
|---|---|---|---|---|---|---|---|---|---|---|---|---|---|---|---|---|
| c-1 | ALD | 500 | 300 | | | | | | 0.2 | 0.6 | 0.5 | 200 | 15 | 0/15nm | P-2 | Normal bulk |
| c-2 | ALD | 500 | 300 | | | | | | 0.2 | 0.6 | 0.5 | 1000 | 3 | 0/15nm | P-2 | Normal bulk |
| c-3 | CVD | 500 | 300 | | | | | | 0.2 | 0.6 | 0.5 | 200 | 15 | 0/15nm | P-1 | Normal bulk |
| c-4 | CVD | 500 | 300 | | | | | | 0.2 | 0.6 | 0.5 | 1000 | 3 | 0/15nm | P-1 | Normal bulk |
| c-5 | CVD | 500 | 300 | | | | | | 0.2 | 0.6 | 0.5 | 1500 | 3 | 0/15nm | P-1 | Normal bulk |
| 1 | ALD | 500 | 300 | 0.2 | 0.6 | 0.5 | 200 | 0.1 | 0.2 | 0.6 | 0.5 | 200 | 15 | 3/12nm | 4 | ※1 |
| 2 | ALD | 500 | 300 | 0.2 | 0.6 | 0.5 | 50 | 0.1 | 0.2 | 0.6 | 0.5 | 1000 | 3 | 3/12nm | 4 | ※1 |
| 3 | ALD | 500 | 300 | 0 | 1 | 0.5 | 200 | 1 | 0.2 | 0.6 | 0.5 | 1000 | 3 | 12/3nm | 5 | bulk:Ti cap:TiN |
| 4 | ALD | 500 | 300 | 0.2 | 1 | 0.5 | 500 | 1 | 0.2 | 0.6 | 0.5 | 1000 | 3 | 2/2nm | 6 | Ti/TiN |
| 5 | CVD | 500 | 300 | 0.2 | 0.6 | 0.5 | 200 | 0.1 | 0.2 | 0.6 | 0.5 | 200 | 15 | 3/12nm | 1 | ※1 |
| 6 | CVD | 500 | 300 | 0 | 0.6 | 0.5 | 50 | 0.1 | 0.2 | 0.6 | 0.5 | 1000 | 3 | 3/12nm | 1 | ※1 |
| 7 | CVD | 500 | 300 | 0.2 | 1 | 0.5 | 200 | 1 | 0.2 | 0.6 | 0.5 | 1000 | 3 | 12/3nm | 2 | bulk:Ti cap:TiN |
| 8 | CVD | 500 | 300 | 0.2 | 1 | 0.5 | 500 | 1 | 0.2 | 0.6 | 0.5 | 1000 | 3 | 2/2nm | 3 | Ti/TiN |
| 9 | CVD | 500 | 300 | 0.2 | 0.6 | 0.5 | 50 | 0.1 | 0.2 | 0.6 | 0.5 | 1000 | 3 | 3/12nm | 1 | ※1 |
| 10 | CVD | 500 | 300 | 0.2 | 1 | 0.5 | 500 | 1 | 0.2 | 0.6 | 0.5 | 1000 | 3 | 2/2nm | 3 | Ti/TiN |
| 11 | CVD | 500 | 300 | 0 | 1 | 0.5 | 200 | 1 | 0 | 1 | 0.5 | 200 | 1 | 3/12nm | 1 | ※1 |

※1: with damage suppression layer

FIG. 13

Evaluation results

| example | Resistivity (μΩcm) | Film Stress (MPa) | Run Rate (nm/min) | Leak current of a base SiO layer @2MV/cm(A/cm2) |
|---|---|---|---|---|
| c-1 | 81 | 70 | 0.5 | 9E-7 |
| c-2 | 83 | -220 | 1 | 3E-7 |
| c-3 | 71 | 0 | 1 | 8E-7 |
| c-4 | 79 | -220 | 3 | 2E-7 |
| c-5 | 70 | -600 | 4 | 9E-7 |
| 1 | 81 | 70 | 0.5 | 1 5E-8 |
| 2 | 83 | -240 | 1 | 6E-8 |
| 3 | 60 | 20 | 2 | 5E-8 |
| 4 | 65 | -50 | 1.8 | 5E-8 |
| 5 | 73 | 29 | 2 | 9E-9 |
| 6 | 77 | -140 | 3 | 4E-8 |
| 7 | 61 | 0 | 5 | 5E-8 |
| 8 | 66 | 74 | 4.7 | 6E-8 |
| 9 | 74 | 105 | 4.8 | 5E-8 |
| 10 | 81 | -50 | 5.5 | 6E-8 |
| 11 | 60 | 100 | 8.1 | 1E-8 |

FIG. 14

METHOD FOR MANUFACTURING SEMICONDUCTOR DEVICE

TECHNICAL FIELD

Examples are described which relate to a method for manufacturing a semiconductor device.

BACKGROUND

There are cases where a metal-based nitride film and a metal having a low resistivity of 100 uΩcm or less are desired, for example, for next-generation devices. However, while such a metal-based nitride film and a metal exhibit low resistivity of 100 uΩcm or less in a thick film, their resistivity may drastically increase in a thin film of 30 nm or less. The film formed at an initial stage of film formation is in an amorphous state and a crystalline film is obtained as the film formation advances. Accordingly, low resistivity may not usually be obtained in a thin film. Thus, the state of crystal growth influences the resistivity of the film. In order to obtain a conductor film of low resistivity, plasma techniques may be used rather than thermal techniques, or the amount of carbon or the like may be reduced to prevent the film from tending to become amorphous due to impurities caused by a precursor.

When a conductor layer is formed of a metal or a metal nitride, damage to a substrate below the conductor layer may be taken into consideration. As described above, a conductor layer with low resistivity may be desired.

SUMMARY

Some examples described herein may address the above-described problems. Some examples described herein may provide a method for manufacturing a semiconductor device capable of reduced damage to a substrate or reduced resistivity.

In some examples, a method for manufacturing a semiconductor device includes forming an initial film having a film thickness of 1 to 3 nm made of a metal or a metal nitride by applying plasma film formation with plasma power of 0.07 to 0.30 W/cm$^2$ and an RF pulse width within a range of 0.1 to 1 sec, and forming, after forming the initial film, a bulk film made of a metal or metal nitride on the initial film by applying plasma film formation with plasma power higher than the plasma power when the initial film is formed.

DETAILED DESCRIPTION

A method for manufacturing a semiconductor device according to some examples will be described with reference to the accompanying drawings. The same or corresponding components will be assigned the same reference numerals and duplicate description may be omitted.

Figure 1:
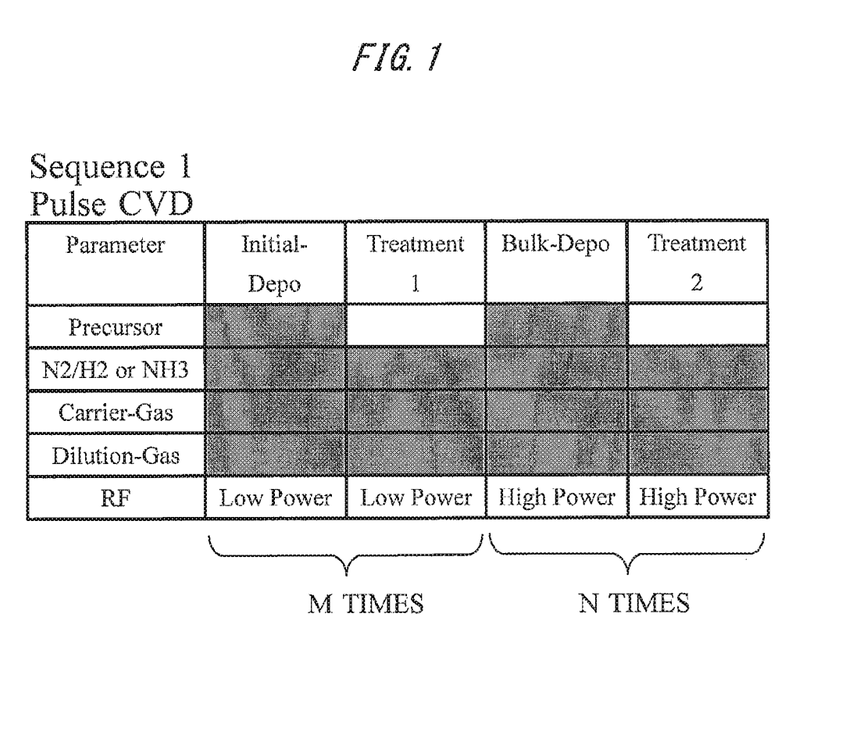
FIG. 1 is a diagram illustrating a film formation sequence using a pulse CVD method.
Figure 14:
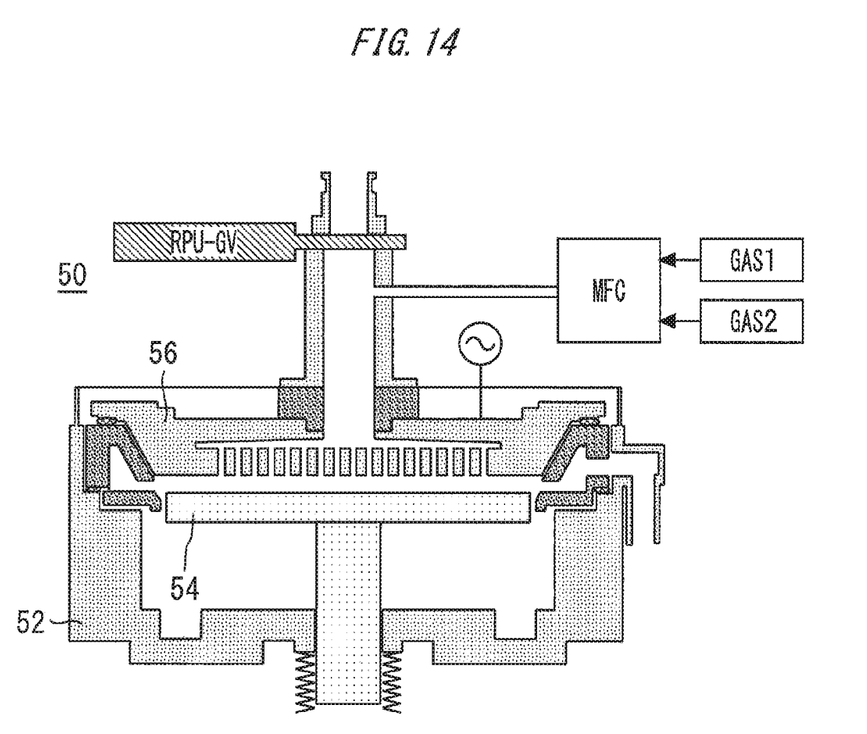
FIG. 14 is a diagram illustrating a film formation apparatus, all arranged in accordance with examples described herein.

FIG. 1 is a diagram illustrating a film formation sequence using a pulse chemical vapor deposition (CVD) method. This film formation sequence may be executed through a film formation apparatus 50 shown in FIG. 14. As shown in FIG. 14, a susceptor 54 and an RF plate 56 placed opposite to the susceptor 54 are provided in the chamber 52, high frequency power is applied to the RF plate 56 while supplying a gas between the susceptor 54 and the RF plate 56 to generate plasma, and a film is thereby formed on a substrate on the susceptor 54. The sequence shown in FIG. 1 includes an initial deposition, a first treatment, a bulk deposition, and a second treatment stage. Various stages may be repeated a number of times as described herein. Additional and/or different stages may be used in other examples. In each stage, FIG. 1 illustrates which gases are present in the chamber, and whether the RF power is provided at a high power or a low power level. For example, in the initial deposition stage, gasses present in the chamber may include: a precursor gas, $N_2/H_2$ or $NH_3$, a carrier gas, and a dilution gas. Low RF power may be used in the initial deposition stage. In the first treatment stage, gasses present in the chamber may include: $N_2/H_2$ or $NH_3$, a carrier gas, and a dilution gas. The precursor gas may not be present during the first treatment stage. Low RF power may be used in the first treatment stage. In the bulk deposition stage, gasses present in the chamber may include: a precursor gas, $N_2/H_2$ or $NH_3$, a carrier gas, and a dilution gas. High RF power may be used in the bulk deposition stage. In the second treatment stage, gasses present in the chamber may include: $N_2/H_2$ or $NH_3$, a carrier gas, and a dilution gas. The precursor gas may not be present during the second treatment stage. High RF power may be used in the second treatment stage.

In sequences in FIG. 1 and other drawings herein, gases in shaded fields are present in a chamber, and gases in not-shaded fields are not substantially present in the chamber. RF power of each stage may be "low power" or "high power". In a stage described as having "Low Power" in an RF field, plasma power of, for example, on the order of 0.07 to 0.30 W/cm$^2$ can be applied to the RF plate. For example, when a substrate subject to film formation is a 300 mm wafer, power of 50 to 200 W may be applied to the RF plate. In a stage described as having "High Power" in the RF field, higher power than that in the stage described as "Low Power" may be applied to the RF plate. In a stage described as having "High Power" in an RF field, plasma power of, for example, on the order of 1.2 to 1.8 W/cm$^2$ can be applied to the RF plate.

In the film formation sequence in FIG. 1, an Initial-Depo stage and a Treatment 1 stage may be executed multiple times (M times as shown in FIG. 1). For example, the initial deposition stage may be performed, then the first treatment stage, followed by the initial deposition stage and another first treatment stage, etc. After performing multiple iterations of an initial-depo stage and a first treatment stage, multiple bulk deposition and second treatment stages may be executed (N times as shown in FIG. 1). M and N are positive integers, and any number may be used. In some examples, the number M may equal the number N. In other examples, the numbers M and N may be different. In the initial deposition stage and the bulk deposition stage, a precursor, $N_2$, $H_2$ or $NH_3$, carrier gas and dilution gas are supplied into the chamber. In the first treatment stage and the second treatment stage, $N_2$, $H_2$ or $NH_3$, carrier gas and dilution gas are supplied into the chamber.

In the initial deposition stage and the first treatment stage, it is possible to set plasma power within a range of 0.07 to 0.30 W/cm$^2$ and set the RF pulse width within a range of 0.1 to 1 sec. Other values may be used in other examples. In the initial deposition stage, plasma treatment is used to form a film made of a metal or metal nitride on the substrate. An initial film having a film thickness of, for example, 1 to 3 nm is formed by executing the initial deposition stage and the first treatment stage multiple times (e.g., M times). The initial film is a film formed with low RF power. The initial film may have a film thickness of 0.2 to 3 nm, for example.

After forming the initial film, the bulk deposition stage and the second treatment stage may be executed multiple times (e.g., N times) consecutively. The set of the bulk deposition stage and the second treatment stage and the set of the initial deposition stage and the first treatment stage may be a similar process, but may different in RF conditions. In some examples, the initial deposition stage may vary from the bulk deposition stage only in RF conditions. In some examples, the first treatment stage may vary from the second treatment stage only in RF conditions. The bulk deposition stage and the second treatment stage may be executed with higher RF power than that of the initial deposition stage and the first treatment stage. By executing the bulk deposition stage and the second treatment stage multiple (e.g., N) times, a bulk film made of a metal or metal nitride on the initial film may be formed by plasma. The bulk film may be a film formed with higher plasma power than the plasma power with which the initial film is formed.

Figure 2:
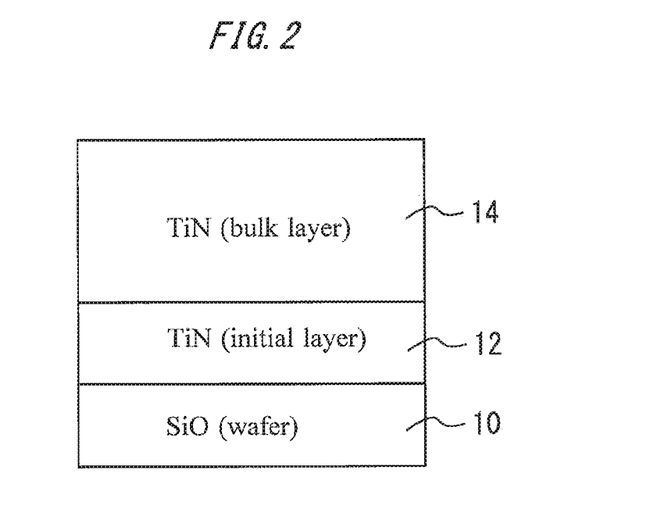
FIG. 2 is a cross-sectional view of an example film formed.

FIG. 2 is a cross-sectional view of the film formed using film formation sequences described herein, such as the film formation sequence in FIG. 1. Substrates described herein may be implemented using an insulative material. In some examples, a substrate may include any material (e.g., a semiconductive and/or conductive material) with an insulative material on a surface. Other materials may be used in other examples. A substrate 10 can be, for example, a Si substrate containing SiO on its surface. The material and shape of the substrate 10 are not particularly limited, but may differ depending on specific steps. An initial film 12 is provided on the substrate 10. Therefore, the initial film 12 is formed on SiO. A bulk film 14 is formed on the initial film 12. The initial film 12 and the bulk film 14 may together form one conductor layer. In the case of FIG. 2, a conductor layer including the initial film 12 and the bulk film 14 is formed on the substrate 10 which may include an insulator.

As described above, since the initial film 12 is formed with low power, it is possible to reduce damage to the substrate 10 compared to the case where the film is formed with high power. Forming the initial film 12 with low power can reduce damage to the substrate caused by metal intrusion into the substrate 10. It is possible in some examples to avoid deterioration of withstand voltage of SiO by preventing and/or reducing metal intrusion into the substrate 10. Therefore, the initial film 12 functions as a protective layer that protects the substrate 10. The initial film 12 also functions as an adhesion layer in some examples that promotes adhesion of the bulk film 14 to the substrate 10. It is possible to make RF power the only difference between a stage when the initial film is formed and a stage when the bulk film is formed. For example, an RF pulse width when the initial film 12 is formed may be set within a range of 0.1 to 1 sec and an RF pulse width when the bulk film 14 is formed may be set within a range of 10 to 20 sec. Forming the bulk film with an RF pulse width longer than that when the initial film is formed may promote crystallization of the bulk film, and can thereby lower the resistivity of the conductor layer. Furthermore, forming the initial film and the bulk film through plasma film formation can promote crystallization compared to thermal film formation using a thermal CVD method or the like. Plasma film formation generally refers to processes which utilize a plasma to provide active species to a substrate to deposit, or aid in depositing, a material layer. Examples of plasma film formation include plasma-enhanced CVD and PEALD.

Figure 3:
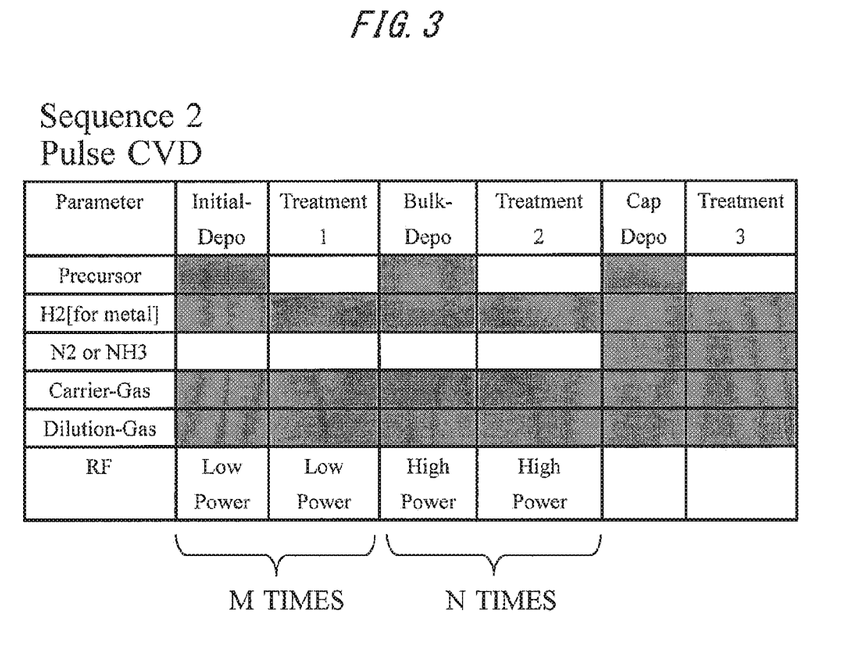
FIG. 3 is a diagram illustrating a film formation sequence using a pulse CVD method according to another example.

FIG. 3 is a diagram illustrating a film formation sequence using a pulse CVD method according to another example. The film formation sequence in FIG. 3 will be described, focusing on differences from the film formation sequence in FIG. 1. A cap deposition stage ("Cap Depo" and a third treatment stage ("Treatment 3") are added to the initial deposition stage, first treatment stage, bulk deposition stage and second treatment stage. In all the six stages, an $H_2$ gas may be introduced into the chamber. $N_2$ or $NH_3$ for forming a nitride film is supplied into the chamber in the cap deposition stage and the third treatment stage.

Figure 4:
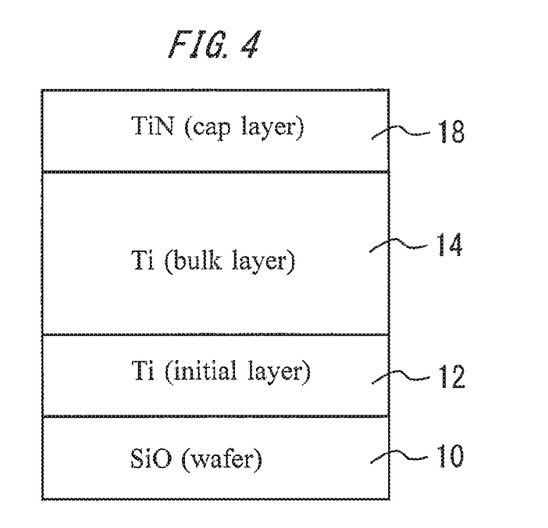
FIG. 4 is a cross-sectional view of the film formed.

FIG. 4 is a cross-sectional view of the film formed using film formation sequences described herein, such as the film formation sequence in FIG. 3. The initial film 12 on the substrate 10 may be a metal. The bulk film 14 on the initial film 12 may also be a metal. The initial film 12 and the bulk film 14 together form one conductor layer. This conductor layer may be a metal such as Ti. Therefore, in some examples, it is possible to obtain a conductor layer with lower resistance than that of a conductor layer made of TiN.

A cap film 18 is formed on the bulk film 14. The cap film 18 is a film formed in the cap deposition stage and the third treatment stage described herein. The cap film 18 may be a metal nitride such as TiN. When the bulk film 14 is made of a metal, the cap film 18 may be formed to inhibit surface oxidation of the bulk film 14. Using a metal nitride as the material of the cap film 18, it may be possible to obtain a high oxidation inhibition effect.

Figure 5:
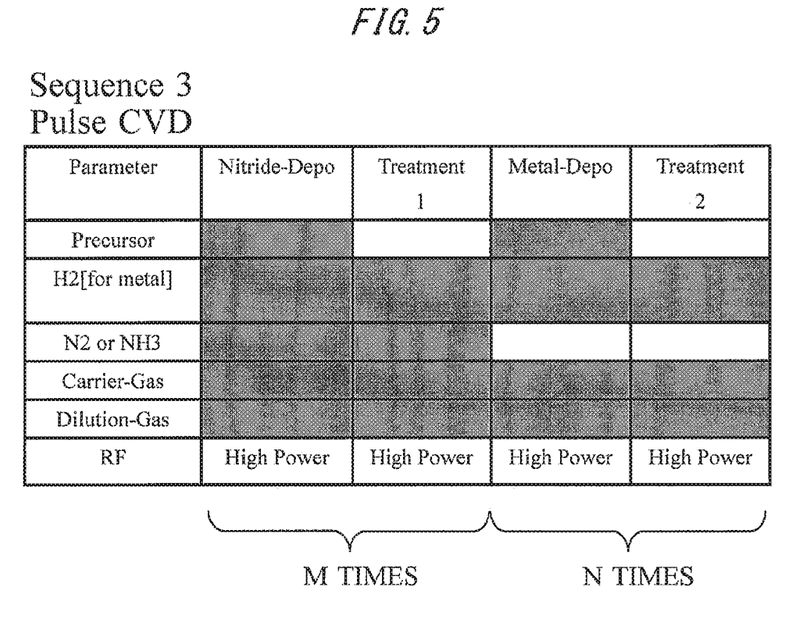
FIG. 5 is a diagram illustrating a film formation sequence using a pulse CVD method according to another example.

FIG. 5 is a diagram illustrating a film formation sequence using a pulse CVD method according to another example. In this film formation sequence, a nitride deposition stage ("Nitride-Depo") and first treatment stage ("Treatment 1") are executed multiple (e.g., M) times, and then a metal deposition stage and the second treatment stage are executed multiple (e.g., N) times. After that, the nitride deposition stage and the first treatment stage are executed multiple (e.g., M times), and then the metal deposition stage and the second treatment stage are executed multiple (e.g., N) times.

Therefore, four layers are formed in this film formation sequence. In some examples, the number M used during the second repetition of the nitride deposition and first treatment stages following the metal deposition and second treatment stages may be different than the number M used before the metal deposition and second treatment stages. In some examples, the number N used during the first metal deposition and second treatment stages may be different than the number N used during the next repetition of those stages following multiple nitride deposition and first treatment stages. In the nitride deposition stage, the following gases may be present in the chamber: precursor, $H_2$, $N_2$ or $NH_3$, carrier gas, and dilution gas. A high RF power may be used in the nitride deposition stage. In the first treatment stage, the following gases may be present in the chamber: $H_2$, $N_2$ or $NH_3$, carrier gas, and dilution gas. A high RF power may be used in the first treatment stage. In the metal deposition stage, the following gases may be present in the chamber: precursor, $H_2$, carrier gas, and dilution gas. A high RF power may be used in the metal deposition stage. In the second treatment stage, the following gases may be present in the chamber: $H_2$, carrier gas, and dilution gas. A high RF power may be used in the second treatment stage.

Figure 6:
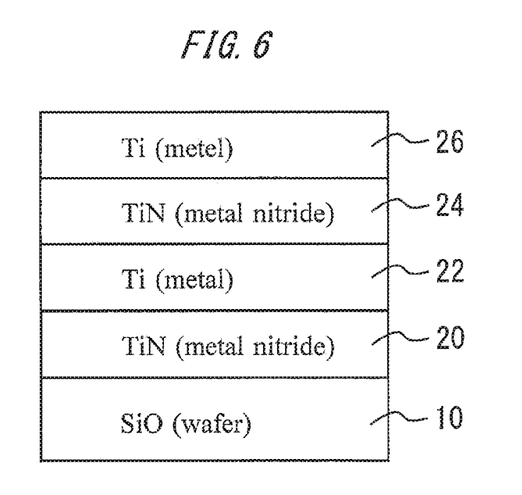
FIG. 6 is a cross-sectional view of the film formed.

FIG. 6 is a cross-sectional view of the film formed using film formation sequences described herein, such as with reference to FIG. 5. By executing the nitride deposition stage and the first treatment stage multiple (e.g., M) times, the first bulk film 20 may be formed on the substrate 10. By executing the metal deposition stage and the second treatment stage multiple (e.g., N) times, a second bulk film 22 may be formed on the first bulk film 20. After that, by executing the nitride deposition stage and the first treatment stage multiple (e.g., M) times, a third bulk film 24 may be formed on the second bulk film 22. After that, by executing the metal deposition stage and the second treatment stage multiple (e.g., N) times, a fourth bulk film 26 may be formed on the third bulk film 24.

The first bulk film 20 may have a film thickness of, for example, 1 to 10 nm. Other thicknesses may also be used. The second bulk film 22, the third bulk film 24 and the fourth bulk film 26 each may have a film thickness of 1 to 10 nm. Other thicknesses may also be used. The first bulk film 20 and the third bulk film 24 may be metal nitrides such as TiN. The second bulk film 22 and the fourth bulk film 26 may be metals such as Ti. These four layers form a laminated structure. The films that form the laminated structure are not particularly limited if they are metals or metal nitrides. A laminated structure may be obtained by forming a plurality of films so that two films directly contacting each other are films of different kinds.

As described in FIGS. 5 and 6, when a laminated structure including a plurality of metal or metal nitride layers is formed on the substrate, interactions among layers occur. This may make it possible in some examples to adjust resistivity of the conductor layer formed on the substrate. For example, by forming the laminated structure including at least the first bulk film 20, the second bulk film 22 and the third bulk film as the conductor layer, it may be possible to achieve film quality different from that in the case where a conductor layer is formed of two layers as shown in FIGS. 2 and 4. FIG. 6 shows that the laminated structure is formed of four layers, but the laminated structure may also be formed of three or more layers.

When the laminated structure is formed on the substrate, if a metal nitride is formed as the first bulk film 20, it may be possible in some examples to cause the metallic second bulk film 22 to come into close contact with the substrate 10. Furthermore, it may be possible in some examples to reduce damage to the substrate 10 by forming the metal nitride directly on the substrate 10 compared to the case where a metal is formed directly on the substrate 10. In FIG. 5, the RF power in the nitride deposition stage and the first treatment stage is shown as high power, but by setting the RF power in these stages to low power, it may be possible in some examples to further reduce damage to the substrate 10. Crystallinity of the film may be improved by setting the RF power in the second and subsequent nitride deposition and first treatment stages to high power.

Thus, it is possible to use a metal nitride for the bottom film which is the film contacting the substrate 10 of the laminated structure and form the bottom film with plasma power lower than that of films above the bottom film.

Figure 7:
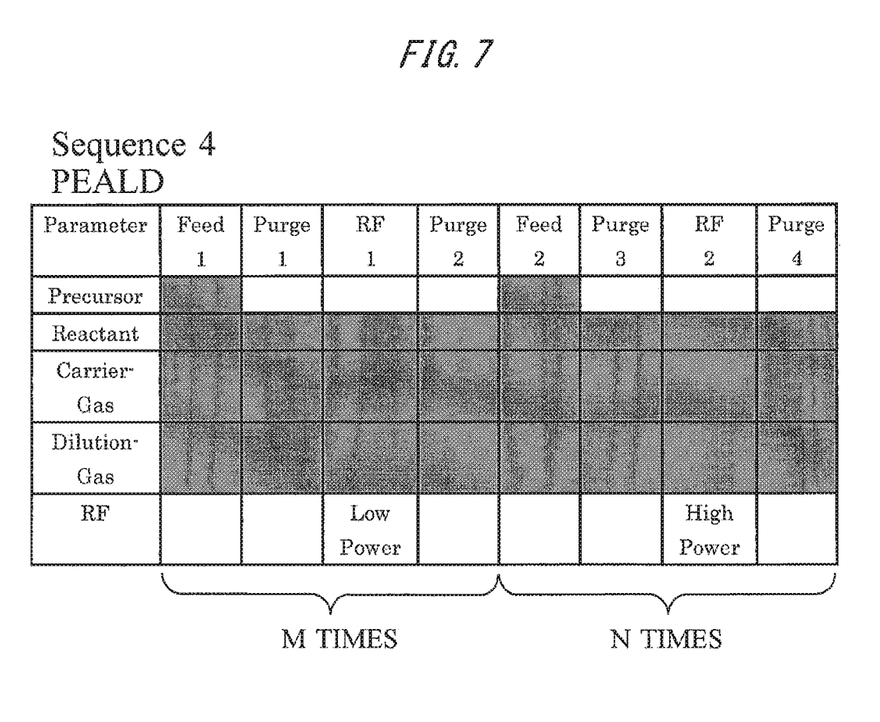
FIG. 7 is a diagram illustrating a film formation sequence using a PEALD.
Figure 8:
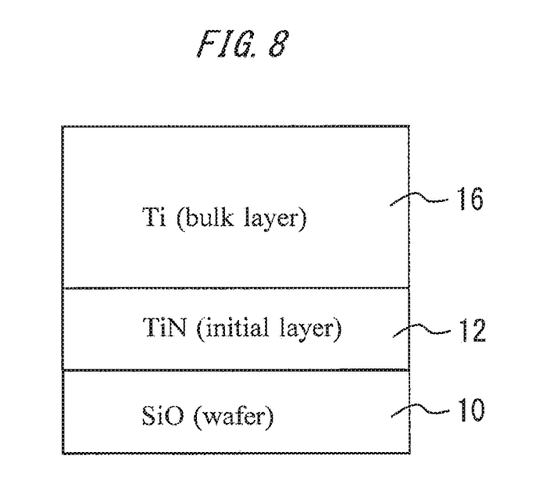
FIG. 8 is a cross-sectional view of the film formed.

FIG. 7 is a diagram illustrating a film formation sequence using a PEALD (pulse-enhanced atomic layer deposition) method according to another example. In this film formation sequence, a process in which a first feed stage ("Feed 1"), a first purge stage ("Purge 1"), a first RF stage ("RF 1"), and a second purge stage ("Purge 2") form one cycle is executed multiple (e.g., M) times to form an initial film. RF power when the initial film is formed is low power. Next, a process in which a second feed stage ("Feed 2"), a third purge stage ("Purge 3"), a second RF stage ("RF 2"), and a fourth purge stage ("Purge 4") form one cycle is executed multiple (e.g., N) times to form a bulk film. RF power when the bulk film is formed is high power. The structure shown in, for example, FIG. 2 can be obtained through the sequence 4 shown in FIG. 8.

A sequence 4 in FIG. 7 generally may be used to implement the structure obtained in the sequence 1 in FIG. 1 using PEALD. An initial film and a bulk film can be formed using the pulse CVD method or the PEALD method. Although the initial film and the bulk film may be metal nitrides, it is also possible to form, for example, the initial film of a metal nitride and form the bulk film of a metal. In that case a structure shown in, for example, FIG. 8 may be obtained.

Figure 9:
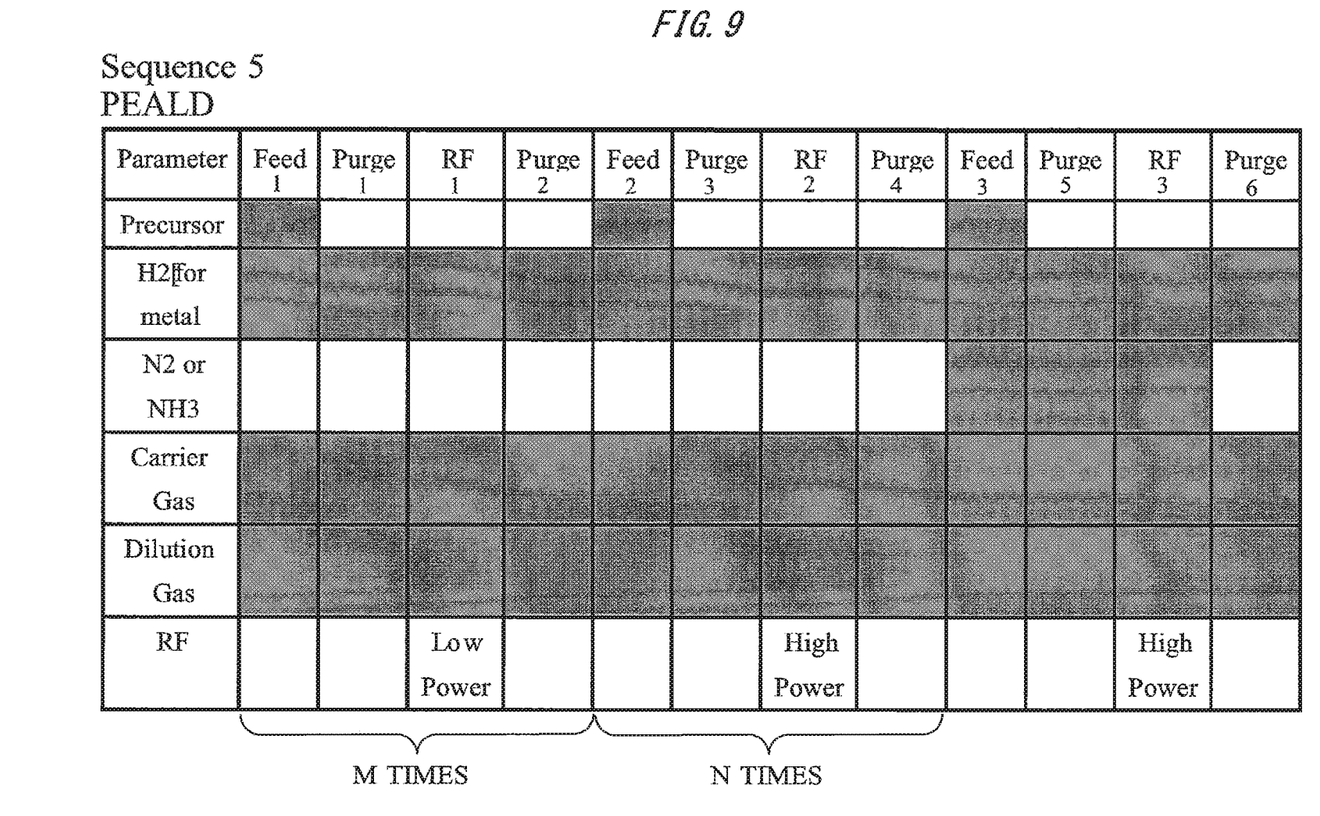
FIG. 9 is a diagram illustrating a film formation sequence using the PEALD method according to another example.

FIG. 9 is a diagram illustrating a film formation sequence using the PEALD method according to another example. In this film formation sequence, a process in which a first feed stage ("Feed 1"), a first purge stage ("Purge 1"), a first RF stage ("RF 1") and a second purge stage ("Purge 2") form one cycle is executed multiple (e.g., M) times to form an initial film. RF power when an initial film is formed is low power. Next, a process in which a second feed stage ("Feed 2), a third purge stage ("Purge 3"), a second RF stage ("RF 2") and a fourth purge stage ("Purge 4") form one cycle is executed multiple (e.g., N) times to form a bulk film. RF power when the bulk film is formed is high power. Next, a third feed stage ("Feed 3"), a fifth purge stage ("Purge 5"), a third RF stage ("RF 3") and a sixth purge stage ("Purge 6") are executed to form a cap film. Through this sequence 5, it is possible to obtain a structure shown in, for example, FIG. 4.

The sequence 5 in FIG. 9 corresponds to the structure obtained in the sequence 2 in FIG. 3 implemented using the PEALD method. An initial film and a bulk film can be formed using the pulse CVD method or PEALD method. In the sequence in FIG. 9, it is possible to obtain a structure including, for example, an initial film made of a metal, a bulk film made of a metal and a cap film made of a metal nitride.

Figure 10:
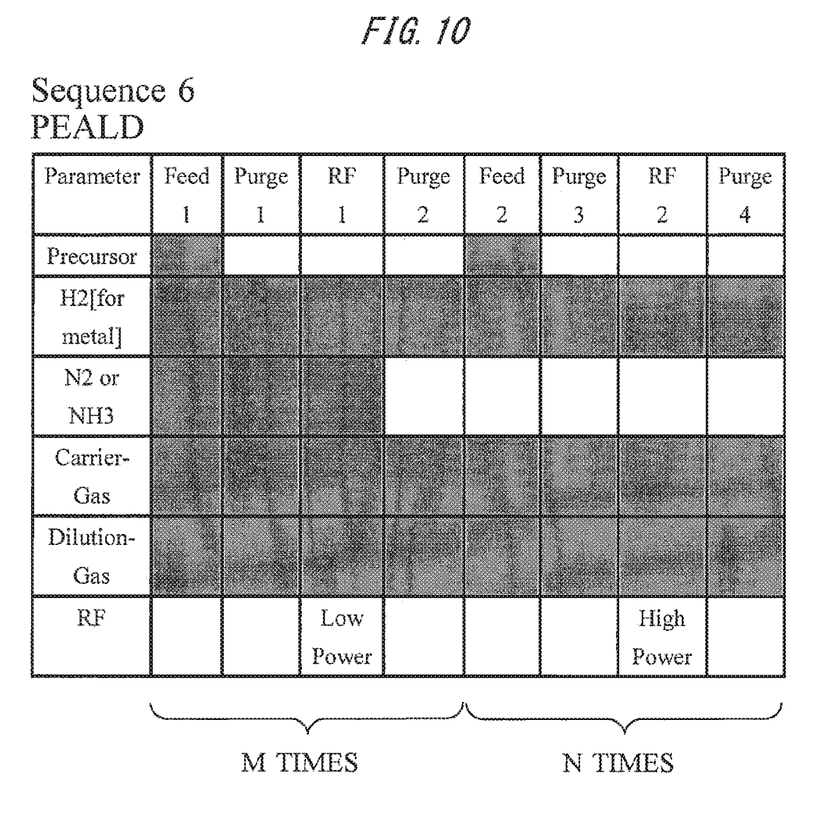
FIG. 10 is a diagram illustrating a film formation sequence using the PEALD method according to another example.

FIG. 10 is a diagram illustrating a film formation sequence using the PEALD method according to another example. In this film formation sequence, a process in which a first feed stage ("Feed 1"), a first purge stage ("Purge 1"), a first RF stage ("RF 1") and a second purge stage ("Purge 2") form one cycle is executed multiple (e.g., M) times to form a first bulk film. Next, a process in which a second feed stage ("Feed 2"), a third purge stage ("Purge 3"), a second RF stage ("RF 2") and a fourth purge stage ("Purge 4") form one cycle is executed multiple (e.g., N) times to form a second bulk film. Next, a process in which a first feed stage ("Feed 1"), a first purge stage ("Purge 1"), a first RF stage ("RF 1") and a second purge stage ("Purge 2") form one cycle is executed multiple (e.g., M) times to form a third bulk film. Next, a process in which a second feed stage ("Feed 2"), a third purge stage ("Purge 3"), a second RF stage ("RF 2") and a fourth purge stage ("Purge 4") form one cycle is executed multiple (e.g., N) times to form a fourth bulk film. Through this sequence 6, it is possible to obtain the structure shown in, for example, FIG. 6.

The sequence 6 in FIG. 10 corresponds to the structure obtained in the sequence 3 in FIG. 5 using the PEALD method. A laminated structure can be formed by forming a plurality of films having a film thickness of 1 to 10 nm with pulse CVD or PEALD method so that two films directly contacting each other are films of different kinds. The films that form the laminated structure may be metals or metal nitrides.

The laminated structure obtained in the sequence 3 or the sequence 6 includes a top film which is the highest film and a sublayer film which is in contact with an undersurface of the top film. By forming the sublayer film of a metal and the top film of a metal nitride, it may be possible in some examples to inhibit surface oxidation of the sublayer film while supplying a low-resistivity conductor layer.

The sequences 1 to 6 have been described so far. In the sequences 1, 2, 4 and 5, the initial film and the bulk film form a conductor layer, whereas in the sequences 3 and 6, a laminated structure is formed in which low resistivity may be achieved by forming three or more thin layers.

Accordingly, it may be possible to form an insulating film on a conductor layer having an initial film and a bulk film. Care may be taken so that such an insulating film may not cause unacceptable insulation of the conductor layer to advance. Insulation of the conductor layer may be inhibited in some examples by forming an insulating film on the bulk film at a temperature of 400° C. or below. In some examples, insulation of the conductor layer may be inhibited by adopting a process of forming the first insulating film on the bulk film through plasma film formation and forming the second insulating film on the first insulating film through plasma film formation, and forming the first insulating film with lower plasma power than plasma power with which the second insulating film is formed.

In some examples, by forming the first insulating film on the bulk film through plasma film formation with $CO_2$ and the second insulating film on the first insulating film through plasma film formation with $O_2$, it is possible in some examples to inhibit insulation of the conductor layer. This is a process taking advantage of the fact that $CO_2$ has lower metal oxidizing capability than $O_2$.

Figure 11:
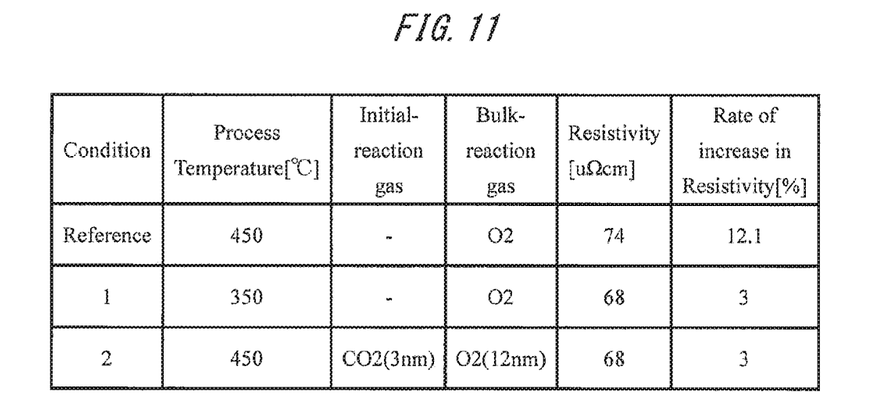
FIG. 11 is a diagram illustrating a relationship between three film formation conditions of the insulating film and resistivity of the conductor layer.

FIG. 11 is a diagram illustrating a relationship between three film formation conditions of the insulating film and resistivity of the conductor layer. For example, TiN may be formed as the conductor layer, a TEOS film having 15 nm may be formed on TiN under the conditions shown in FIG. 11, and the resistivity of the conductor layer and a rate of increase in resistivity are examined.

Reference in FIG. 11 refers to an example where assuming that a film formation temperature is 450° C., an insulating film is formed on a conductor layer through film formation using $O_2$ as a raw material. In this case, the rate of increase in resistivity of the conductor layer is as high as 12.1% compared to that before formation of the insulating film.

Condition 1 is an example where assuming that a film formation temperature is 350° C., an insulating film is formed on a conductor layer through film formation using $O_2$ as a raw material. In this case, the rate of increase in resistivity is reduced to 3%. The inventor discovered that forming the insulating film at a film formation temperature of 400° C. or below would be able to suppress the rate of increase in resistivity significantly in some examples.

Condition 2 is an example where assuming that a film formation temperature is 450° C., a first insulating film is formed through plasma film formation using $CO_2$ and a second insulating film is formed through plasma film formation on the first insulating film using $O_2$, and an insulating film is thereby formed on the conductor layer. The rate of increase in resistivity is reduced to 3% in this case, too.

After forming the laminated structure using the sequences 3 and 6, an insulating film may be formed on the laminated structure. Insulation of the laminated structure can be inhibited by adopting the aforementioned insulating film formation method in this case, too. For example, an insulating film can be formed on the laminated structure at a temperature of 400° C. or below. In some examples, it may be possible to inhibit insulation of the laminated structure by adopting a process of forming the first insulating film on the laminated structure through plasma film formation and forming the second insulating film on the first insulating film through plasma film formation, and forming the first insulating film with plasma power lower than that of the second insulating film.

In some examples, it may be possible to inhibit insulation of the laminated structure by forming the first insulating film through plasma film formation using $CO_2$ and forming the second insulating film on the first insulating film through plasma film formation using $O_2$. A silicon-based oxide film or a nitride film can be formed through a vacuum transport system after a conductor layer is formed in both a case where a conductor layer including the initial film and the bulk film is formed on a substrate and a case where a conductor layer is formed in a laminated structure.

In the above-described sequences, it is possible, for example, to reduce damage to the substrate 10 or reduce resistivity of the conductor layer. In the above-described sequences, Ti as a metal and TiN as a metal nitride are shown as examples. TiCl4 or TDMAT can be used as a precursor when forming Ti, Ti, W, Co, Mo, Al or their nitrides can be used as the materials of the initial film and the bulk film. Ti, W, Co, Mo, Al or their nitrides can be used as the material of the films forming the laminated structure.

By performing a treatment process using a nitride gas or hydride-based gas during formation of the initial film, after formation of the initial film, during formation of the bulk film or after formation of the bulk film, it is possible to remove and/or reduce impurities in the conductor layer or reduce resistivity of the conductor layer. This treatment process may be a treatment process to be performed separately from the treatment described in the sequences 1 to 6. By performing the treatment process using a nitride gas or hydride-based gas during formation of the laminated structure or after formation of the laminated structure, it may be possible to remove and/or reduce impurities in the laminated structure or reduce resistivity of the laminated structure. For example, a mixed gas of $H_2$ and $N_2$ or $NH_3$ can be used as the nitride gas. For example, a hydrogen gas can be used as the hydride-based gas.

By performing all the respective processes in the sequences 1 to 6 sequentially and in the same reactor chamber, it may be possible to prevent and/or reduce intrusion of carbon or the like into the conductor layer and reduce resistivity of the conductor layer. For example, films forming the laminated structure are formed consecutively in the same chamber. Furthermore, by executing stages described in the respective sequences at the same temperature, it may be possible to prevent and/or reduce the surface of the conductor layer from being changed by a temperature change.

Figure 12:
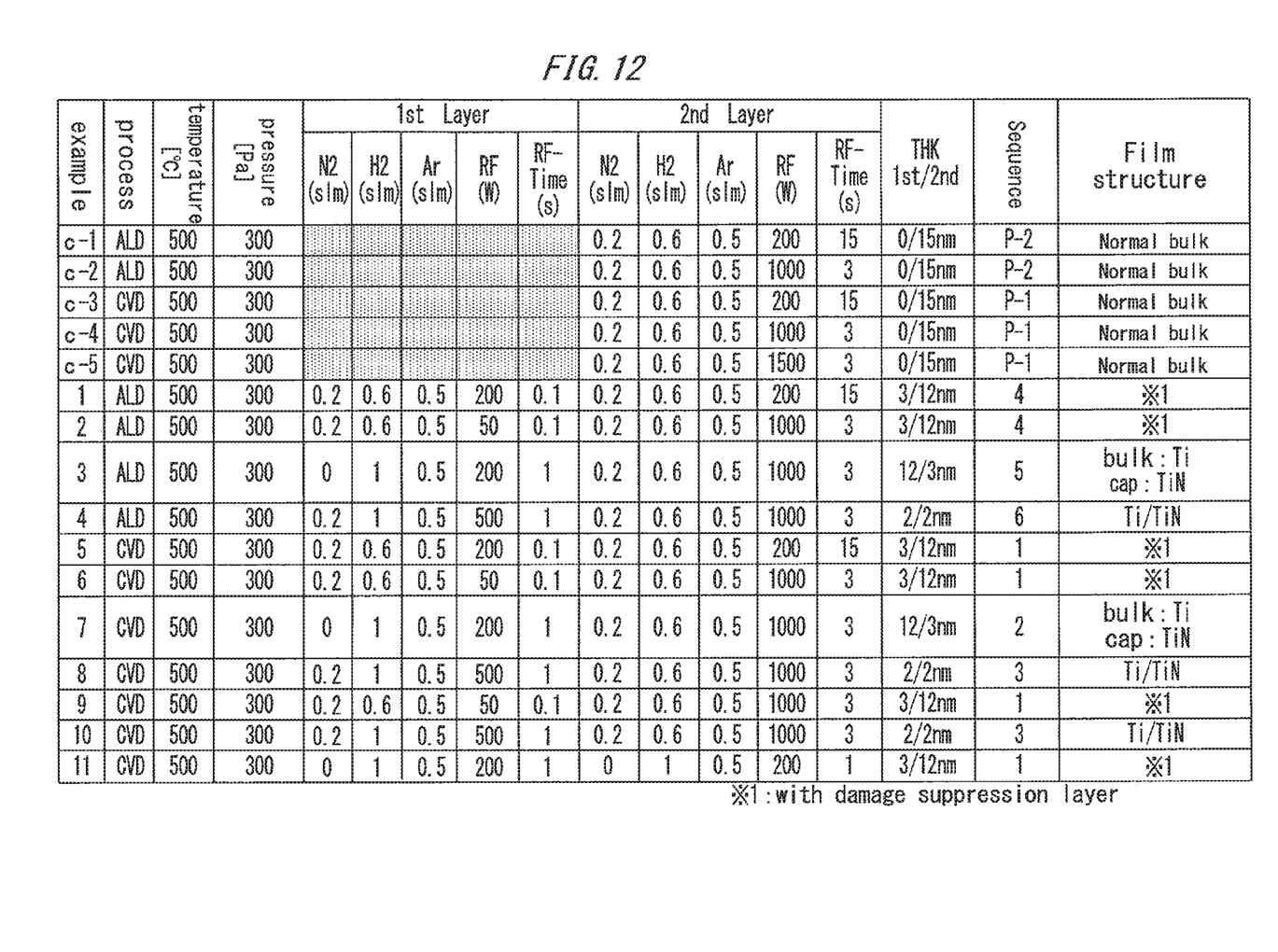
FIG. 12 is a diagram illustrating film formation conditions in a plurality of examples.

FIG. 12 is a diagram illustrating film formation conditions in a plurality of examples. Reference numerals c-1, c-2, c-3, c-4 and c-5 denote comparative examples presented for comparisons with Examples 1 to 11. Five comparative examples and Examples 1 to 11 are processes for forming a conductor layer on a substrate. However, in Examples 1 to 11, the first layer and the second layer are laminated one on another to form a conductor layer, while in the five comparative examples, the conductor layer is formed using only one layer. In all the film formation processes shown in FIG. 12, 2 slm of Ar is used as a carrier, and a conductor layer having a film thickness of 15 nm or 4 nm is formed with parallel flat plates which has a gap of 10 mm for plasma formation.

When film formation is performed using ALD, the feed time and the purge time are set to 0.1 sec and 1 sec, respectively. On the other hand, when film formation is performed using CVD, the deposition time is set to 0.1 sec in Examples 5 to 8, and 11 and the deposition time is set to 0.2 sec in Examples 9 and 10. The numbers described in the sequence field correspond to the aforementioned sequence numbers. For example, in the case of Example 1, "4" is described in the sequence field, and so the process of the sequence 4 shown in FIG. 7 is performed. Note that for the five comparative examples, no corresponding sequences are described above, and so the sequences are assumed to be P1 to P5.

Figure 13:
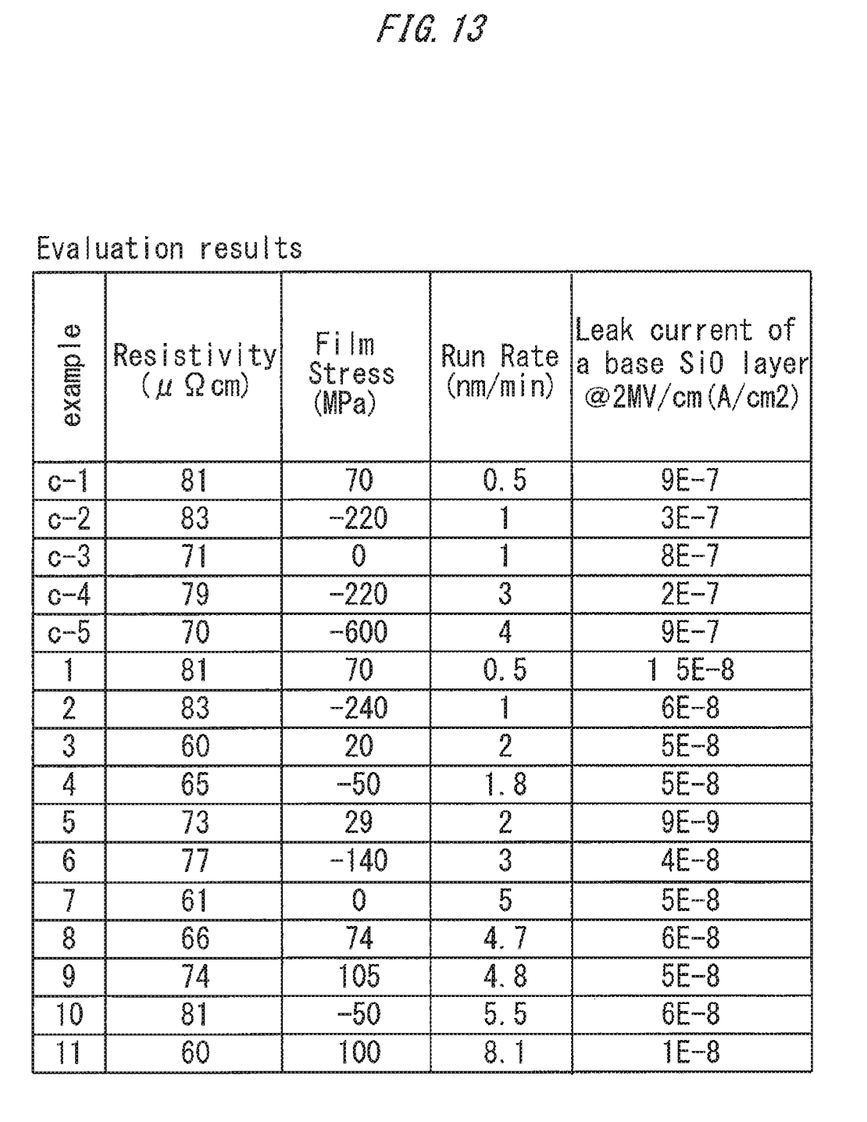
FIG. 13 is a diagram illustrating evaluation results.

FIG. 13 is a diagram illustrating evaluation results of the samples formed under the film formation conditions shown in FIG. 12. "Run rate" represents a growth speed of a film during film formation. A "leak current of a base SiO film" describes a leak current measured by applying 2 MV/cm to the SiO film which is the base of the conductor layer after forming the conductor layer under respective conditions. Under conditions c-1 to c-5 according to the comparative examples, relatively large leak currents are generated, and so it is seen that the base SiO film is damaged under these conditions. On the other hand, in Examples 1 to 11, it is seen that a leak current can be inhibited. In Examples 1 to 11, it is assumed that the leak current is inhibited by reducing plasma power to, for example, on the order of 0.07 to 0.30 W/cm$^2$ at an initial stage of the formation of the conductor layer and lowering the RF pulse width described in the RF-Time field to, for example, on the order of 0.1 to 1 sec.

What is claimed is:

1. A method for manufacturing a semiconductor device, the method comprising:
   forming an initial film having a film thickness of 1 to 3 nm comprising a metal or a metal nitride by applying plasma film formation with plasma power of 0.07 to 0.30 W/cm$^2$ and an RF pulse width within a range of 0.1 to 1 seconds, wherein the initial film is formed on a substrate and wherein SiO is provided on a surface of the substrate and the initial film is formed on the SiO;
   forming, after forming the initial film, a bulk film comprising a metal or a metal nitride on the initial film by applying plasma film formation with plasma power higher than the plasma power used during said forming the initial film; and
   forming an insulating film on the bulk film.

2. The method for manufacturing a semiconductor device according to claim 1, wherein the initial film and the bulk film are formed using a pulse CVD method or a PEALD method, and the initial film is a metal nitride and the bulk film is a metal nitride.

3. The method for manufacturing a semiconductor device according to claim 1, wherein
   the initial film and the bulk film are formed using a pulse CVD method or a PEALD method, and
   the initial film is a metal and the bulk film is a metal.

4. The method for manufacturing a semiconductor device according to claim 1, further comprising performing a treatment process using a nitride gas or hydride-based gas during formation of the initial film, after formation of the initial film, during formation of the bulk film or after formation of the bulk film.

5. The method for manufacturing a semiconductor device according to claim 1, wherein the initial film and the bulk film are formed consecutively in a same reactor chamber.

6. The method for manufacturing a semiconductor device according to claim 1, wherein the initial film and the bulk film comprise Ti, W, Co, Mo or Al or a nitride of Ti, W, Co, Mo or Al, or combinations thereof.

7. The method for manufacturing a semiconductor device according to claim 1, wherein the insulating film is formed on the bulk film at a temperature of 400° C. or below.

8. The method for manufacturing a semiconductor device according to claim 1, further comprising:
   forming, using a plasma, a first insulating film on the bulk film using a first plasma power; and
   forming, using a plasma, a second insulating film on the first insulating film using a second plasma power, wherein
   the first plasma power is lower than the second plasma power.

9. The method for manufacturing a semiconductor device according to claim 1, further comprising:
   forming, using a plasma, a first insulating film on the bulk film using $CO_2$; and
   forming, using a plasma, a second insulating film on the first insulating film using $O_2$.

10. A method for manufacturing a semiconductor device comprising forming a laminated structure by forming a plurality of films, wherein individual ones of the plurality of films having have a film thickness of 1 to 10 nm on a substrate using a pulse CVD method or PEALD method such that each film is in contact with another film of a different kind, wherein
    the plurality of films forming the laminated structure are metals or metal nitrides, and wherein the plurality of films includes at least three films.

11. The method for manufacturing a semiconductor device according to claim 10, wherein a bottom film of the plurality of films which is in contact with the substrate of the laminated structure is a metal nitride and the bottom film is formed with plasma power lower than plasma power with which films above the bottom film are formed.

12. The method for manufacturing a semiconductor device according to claim 10, wherein
the laminated structure comprises a top film of the plurality of films which is a highest film and a sublayer film in contact with an undersurface of the top film, and
the sublayer film is a metal and the top film is a metal nitride.

13. The method for manufacturing a semiconductor device according to claim 10, further comprising performing a treatment process using a nitride gas or hydride-based gas during formation of the laminated structure or after formation of the laminated structure.

14. The method for manufacturing a semiconductor device according to claim 10, comprising forming the plurality of films of the laminated structure consecutively in a same chamber.

15. The method for manufacturing a semiconductor device according to claim 10, wherein the films forming the laminated structure comprise Ti, W, Co, Mo or Al or a nitride of Ti, W, Co, Mo or Al, or combinations thereof.

16. The method for manufacturing a semiconductor device according to claim 10, further comprising forming an insulating film on the laminated structure at a temperature of 400° C. or below.

17. The method for manufacturing a semiconductor device according to claim 10, further comprising:
forming, using a plasma, a first insulating film of the plurality of films of the laminated structure using a first plasma power; and
forming, using a plasma, a second insulating film of the plurality of films on the first insulating film using a second plasma power, wherein
the first plasma power is lower than the second plasma power.

18. The method for manufacturing a semiconductor device according to claim 10, further comprising:
forming, using a plasma, a first insulating film on the laminated structure using $CO_2$; and
forming, using a plasma, a second insulating film on the first insulating film using $O_2$.

* * * * *